US007408793B2

(12) United States Patent
Jitaru et al.

(10) Patent No.: US 7,408,793 B2
(45) Date of Patent: Aug. 5, 2008

(54) ACTIVE SNUBBER

(75) Inventors: Ionel D. Jitaru, Tucson, AZ (US); George Casaru, Bucharest (RO)

(73) Assignee: DET International Holding Limited, Grand Cayman (KY)

( * ) Notice: Subject to any disclaimer, the term of this patent is extended or adjusted under 35 U.S.C. 154(b) by 168 days.

(21) Appl. No.: 10/545,567

(22) PCT Filed: Feb. 11, 2003

(86) PCT No.: PCT/US03/03959

§ 371 (c)(1), (2), (4) Date: Jun. 16, 2006

(87) PCT Pub. No.: WO2004/073132

PCT Pub. Date: Aug. 26, 2004

(65) Prior Publication Data

US 2006/0244428 A1 Nov. 2, 2006

(51) Int. Cl.
*H02H 7/125* (2006.01)
*H02H 7/122* (2006.01)

(52) U.S. Cl. ...................................... 363/52; 363/56.12

(58) Field of Classification Search .............. 363/21.02, 363/52, 53, 55, 56.01, 56.05, 56.08, 56.11, 363/56.12; 323/222; 361/91.7
See application file for complete search history.

(56) References Cited

U.S. PATENT DOCUMENTS

| | | | | |
|---|---|---|---|---|
| 4,272,705 | A | | 6/1981 | Beaumont |
| 4,814,966 | A | | 3/1989 | Ekstrand |
| 5,877,947 | A | * | 3/1999 | Chen et al. .................... 363/53 |
| 6,051,961 | A | * | 4/2000 | Jang et al. ................ 363/56.11 |
| 6,069,803 | A | * | 5/2000 | Cross ...................... 363/56.11 |

* cited by examiner

*Primary Examiner*—Jessica Han
(74) *Attorney, Agent, or Firm*—Gallagher & Kennedy, P.A.; Thomas D. MacBlain

(57) ABSTRACT

An improved snubber is electrically switched to close a current path to a capacitor (C) in a series connected RC circuit at the onset of an abrupt voltage change otherwise producing ringing in a resonant circuit to which the snubber circuit is connected. The current path to the capacitor (C) is then interrupted before the capacitor (C) discharges and thereafter at each such voltage change in the resonant circuit the capacitor (C) is no longer charged from its totally discharged state but nevertheless damps the ringing by virtue of current flow to the nearly completely charged capacitor (C). By preventing complete charging and discharging of the capacitor (C) in the RC circuit every cycle, power dissipation in the resistance of the snubber circuit is greatly reduced.

8 Claims, 8 Drawing Sheets

ACTIVE SNUBBER

BACKGROUND OF THE INVENTION

This invention relates to circuit provisions for damping resonant ringing in an electrical circuit, and more particularly to a switched RC circuit connected with a resonant circuit to damp ringing.

In power devices such as DC-DC converters, abrupt voltage changes can result in transient ringing in the primary and secondary circuits of a transformer. For example, for a regular DC-DC converter, the rectification in a power transformer secondary uses one or more ultra fast or Schottky rectifiers. The leakage inductance of the transformer may interact resonantly with the reverse recovery current and/or with the junction capacitance of the output rectifier diode(s). The leakage inductance and the junction capacitance together with all the parasitic inductances and capacitances of the layout determine the resonant frequency. This resonant circuit has low losses. As a result, many cycles of ringing will occur after the first spike. Also, the ringing generates an overvoltage that constitutes the maximum reverse voltage across the rectifier. This can exceed the diode maximum voltage rating, or it may require larger, more expensive components than would be needed in the absence of such overvoltage. The ringing is present in the current flowing in the secondary side as well. The transformer then reflects the ringing to the primary side of the circuit. This can affect a current sense signal used by the controller when it is located in primary side and the converter works in current mode control. To avoid these problems, the ringing must be damped. However, the damping should be optimized since an excessive damping will increase the switching time and switching losses will become more significant.

FIG. 1 illustrates, for purposes of explanation, what probably is the most common circuit 25 used to suppress the voltage transient spikes. This is a typical RC snubber. It is a serial RC circuit 26 connected in parallel with a switching element shown for purposes of explanation in FIG. 1 as a simple switch SW. It can, however, be a discrete or integrated semiconductor switching device. In the absence of the snubber, when the switch abruptly opens the ringing occurs in the resonant circuit 28.

The value of the snubber capacitor will help define the resonant frequency of the circuit. This is another advantage because this frequency will be less dependent on the parasitic capacitances of the switching element or circuit layout and will be dictated mainly by the value of the snubber capacitor. This helps with EMI filtering by limiting the high frequency harmonics.

The snubber 25 is dissipative. Transferring the energy stored in the leakage and parasitic inductances to the snubber capacitor, a fraction of it is dissipated across the snubber resistor. Thus the snubber absorbs some energy at every voltage transient across the switch SW. The effect is the damping of the parasitic ringing at the moment when the switch opens. To properly damp the ringing, the value of the resistor is important. It should be close to the characteristic impedance of the parasitic resonant circuit.

The main disadvantage of this usual snubber 25 is the power lost cycle by cycle to charge the capacitor of the snubber from zero to the maximum value of the overvoltage across the switch. This energy is proportional to the value of the capacitor, the switching frequency and the square value of the voltage swing on the capacitor. Depending on the value of the voltage swing, these losses may become significant for power devices such as high efficiency DC-DC converters.

FIG. 2 schematically illustrates the standard RC snubber in the context of the equivalent circuit of a DC-DC converter shown as Li is the leakage inductance of a power transformer primary binding. An ultrafast or Shottky diode D2 serves as the output rectifier. The snubber circuit consists of a series-connected capacitor 30 and resistor 32 connected in parallel with the diode D2. An input approximating a square wave is applied at Vi. Power transformer inductance on the output side is represented at Lo and an output voltage Vo appears across the output capacitor Co.

In the single ended forward topology of FIG. 2, it is the free wheeling diode D2 that is the switching element that causes ringing requiring a snubber. When the diode D2 opens, ringing occurs as described above. FIGS. 3 and 4 show the voltage wave form across the diode D2 before and after application of the snubber. $V_c$ the voltage across the capacitor 30 follows $V_{D2}$. Each time $V_{D2}$ ramps up, capacitor C charges. Each time $V_{D2}$ ramps down, capacitor C discharges completely.

For efficient power device operation, it would be beneficial, where a snubber is used to damp ringing, to reduce the losses that occur as a result of current flow in the RC snubber circuit during the charging and discharging of the capacitor.

SUMMARY OF THE INVENTION

In accordance with this invention, there is provided a resonant circuit that includes a snubber circuit that damps resonant ringing and a switch to, first, complete a current path to a capacitive element at the onset of an abrupt voltage change and to, second, interrupt the current path to the capacitive element to prevent a complete transition in the charge state of the capacitive element thereafter. More particularly, the switch is preferably an electrically controlled switching device. In a preferred embodiment, the switch is electrically closed during the period of abrupt voltage change in a resonant circuit and is electrically opened once damping is completed.

In a preferred embodiment of the invention, the switch is a semiconductor device in series with the capacitive element of the snubber. The snubber can be an RC circuit path in parallel with a circuit's primary switching device. Where the circuit is a power device, that switching device may be an ultrafast or Shottky diode across the secondary of a power transformer.

Preferably, in accordance with a preferred embodiment of the invention, the resistance of the RC snubber circuit is close to the characteristic impedance of the parasitic resonant circuit that the snubber serves. In one preferred embodiment of the invention, the electrically controlled switch is a MOSFET device in series with the RC circuit that is the snubber. The electrically controlled switch can be, however, any of a number of fast switching devices including NPN or PNP discrete transistors, a CMOS transistor, either discrete or integrated, an SCR or any other precisely electrically controlled fast switch or switching device. Further, in accordance with a preferred embodiment of the invention, the electrically controlled switch completes a current path during each abrupt voltage increase in the resonant circuit to cause charging of the capacitor of the snubber to begin before the first spike or resonant overshoot occurs across the primary switch. The electrically controlled switch then interrupts the current path to the charged snubber capacitor to prevent its complete discharge. Subsequently, the capacitor is not charged from a totally discharged state to its fully charged state and is, in use, never completely discharged. Rather, the capacitor has held a large part of its charge and little current is required to recharge it during the snubber's damping. Consequently, there is considerably less power dissipation in the resistor of the snubber circuit.

The above and further objects and advantages of the invention will be better understood from the following detailed description of at least one preferred embodiment of the invention, taken in consideration with the accompanying drawings.

DETAILED DESCRIPTION

Figure 5:
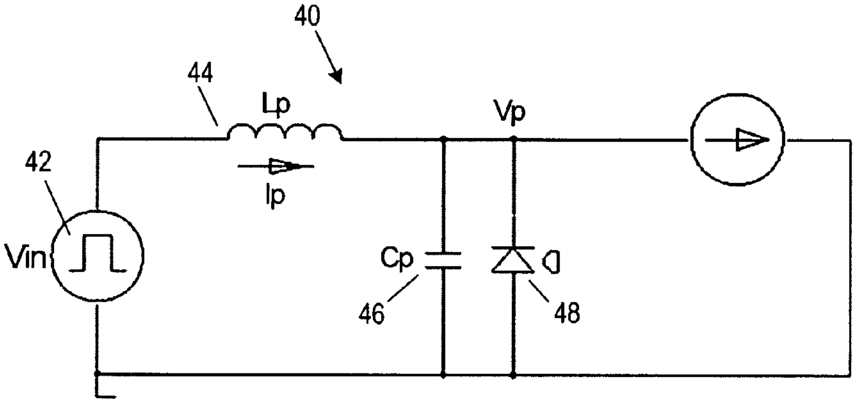
FIG. 5 is a generalized schematic illustration of a resonant circuit having an output rectifying diode and no damping.
Figure 6:
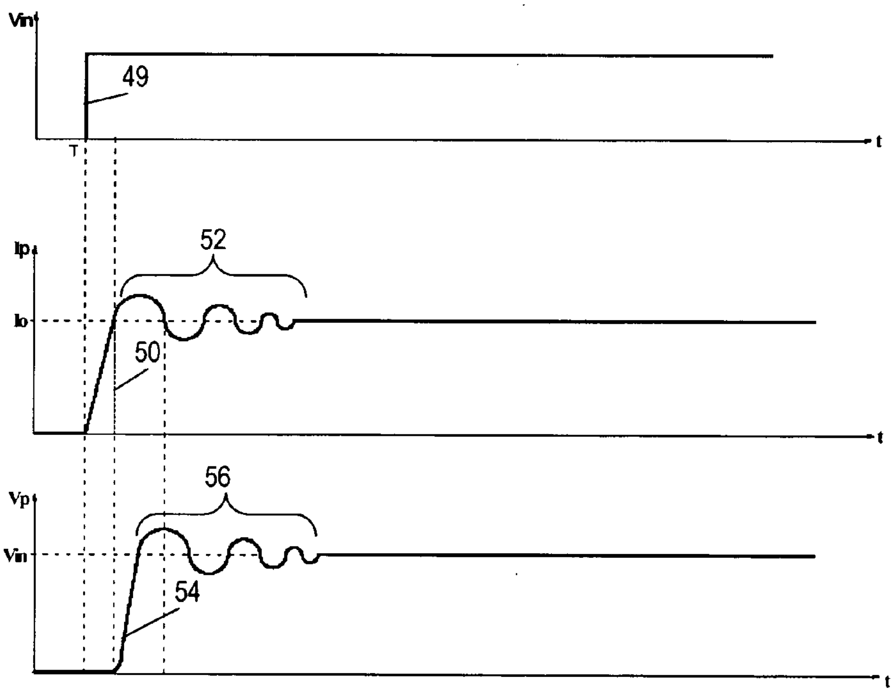
FIG. 6 is a series of plots versus time of input voltage, inductor current, and voltage across the diode in the circuit of FIG. 5.

Turning now to FIG. 5, a generalized resonant circuit 40 is shown there in accordance with the prior art. An input voltage Vin is applied at 42. The input voltage has abrupt rise and fall times and is of the nature of a square wave as shown. In FIG. 6, the input voltage is depicted with an abrupt rise time at time T. The circuit 40 has an inductance Lp as would a power device with a transformer primary 44 to be driven by the input voltage Vin. A capacitor 46 has a capacitance $C_p$ which could be, for example, parasitic capacitance in the circuit 40. The inductance Lp and capacitance Cp, then, form a resonant tank circuit. An output rectifier diode 48 switches from its non-conducting to its conducting state responsive to Vin. Current in the diode 48 is plotted at 50 in FIG. 6. Ringing is apparent at turn-on in the region 52. Ringing is likewise apparent in the plot 54 of Vp versus time in the region 56. Spiking at the outset of turn-on causes stress on the diode 48 to be almost twice that where just Vin is present.

Figure 1:
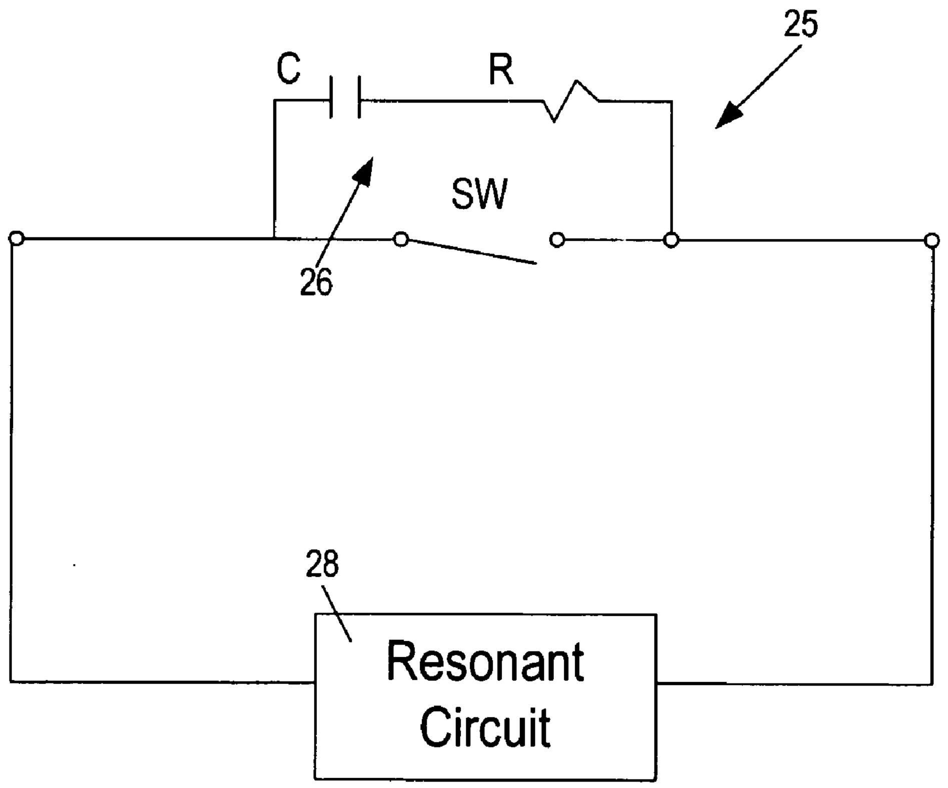
FIG. 1 is a schematic illustration, partially in block diagram, of a prior art snubber connected across a switching device, preventing ringing in a resonant circuit.
Figure 7:
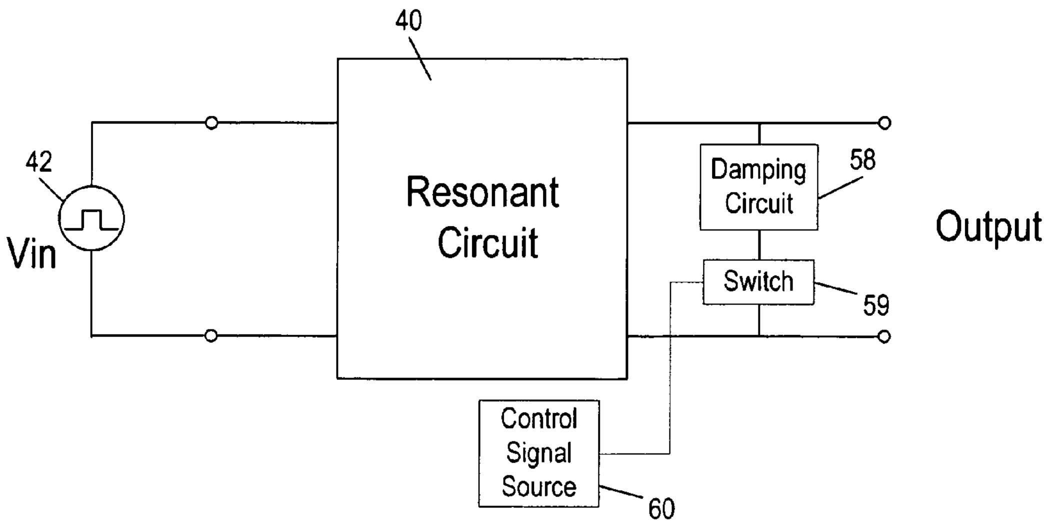
FIG. 7 is a diagrammatic block diagram of a generalized power device having a snubber circuit including an electrically controlled switch in accordance with the present invention.

In FIG. 7, the component parts of the active snubber in accordance with the invention are shown in functional block diagram form. A voltage Vin, again approximating a square wave is applied at 42 as in the prior art circuit of FIG. 5. Two way resonant circuit 40, a damping circuit 50, however, is connected with the resonant circuit 40. An electrically controlled switch 59 is connected in series with the damping circuit 50 to complete or interrupt current flow to the damping circuit as controlled by a control signal source 60. The timing of the opening and closing of the switch 59 by the control signal source 60 is described in greater detail below in connection with specific exemplary embodiments. The signal applied to the switch 59 by the source 60 may be derived from the input voltage 42, from a separate auxiliary coil on a power transformer (not shown in FIG. 7), from a controller (not shown) controlling a main switching element as represented by the switch SW of FIG. 1, or in any convenient fashion capable of precisely tiring the switch activation signals applied to open and close the switch 59.

Figure 8:
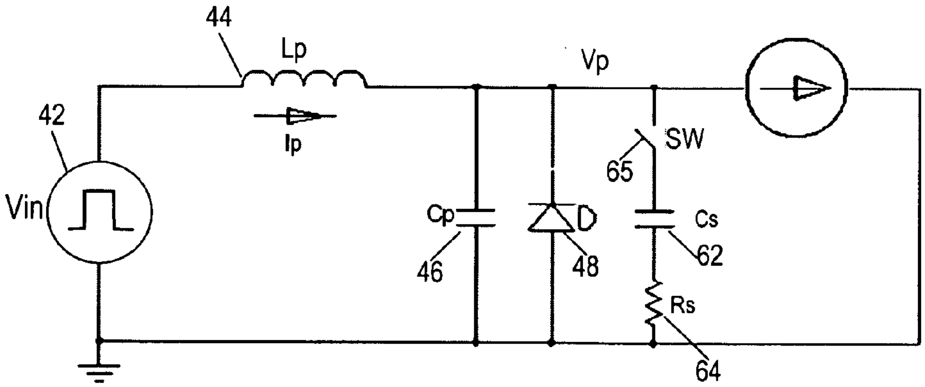
FIG. 8 is a schematic illustration of a circuit like that of FIG. 5 and including an active snubber in accordance with the present invention.

In FIG. 8, a generalized schematic like that of FIG. 5 is shown wherein like elements are given like reference numerals. In the circuit of FIG. 8 an active snubber circuit of the present invention is employed. A snubber capacitor 62 and snubber resistor 64 from a series RC damping circuit 50 are connected in parallel with the capacitor 46 and diode 48. Unlike the prior art snubber circuits used to damp resonant ringing, the serial snubber circuit that includes the capacitor 62 and resistor 64 also includes a switch 65 connected in series.

Figure 3:
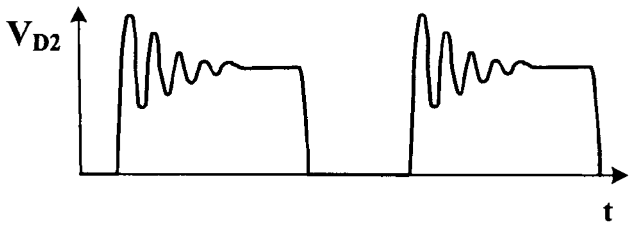
FIG. 3 is a plot against time of voltage across an output rectifier diode in a DC-DC converter like that illustrated in FIG. 2, but without a snubber.
Figure 4:
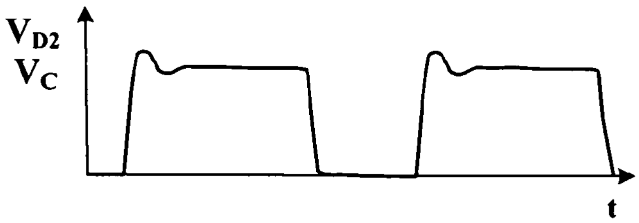
FIG. 4 is a plot against time of a voltage across the output rectifier diode or snubber capacitor of FIG. 2.

In FIG. 9, the plot 49 is again the input voltage Vin illustrated in FIG. 4. The plot 66 illustrates at 67 the highly damped current $I_p$ as compared to $I_p$ illustrated in the region 52 of FIG. 3. Likewise, the voltage $V_p$ across the diode 48 is plotted at 68 and shows in the region 70 the effect of damping by the RC circuit made up of the resistor 64 and the capacitor 62.

In the circuit of FIG. 8, switching by the switch 65 is timed. At the time the switch 62 is turned on (i.e. closed), the snubber capacitor 62 charges parasitic capacitor 46 through the resistor 64 quickly, before an additional amount of energy accumulates in the inductor 44. Thus the current $I_p$ in the inductor 44 remains close to Io. The snubber capacitor 62 is then allowed to charge through the snubber resistor 64. This restores any energy lost during the charging of the parasitic capacitor 46. Any residual ringing is damped by the resistance 64. At a time T2 after the capacitor 62 is charged, the switch 65 is opened, conserving the charge on the capacitor before the input voltage drops from Vin to 0. The switched RC snubber circuit has the advantage that it prevents energy going into the tank circuit of inductor 44 and capacitor 46 and only dissipates the energy needed to dampen ringing. Energy is conserved by keeping capacitor 62 charged.

Figure 2:
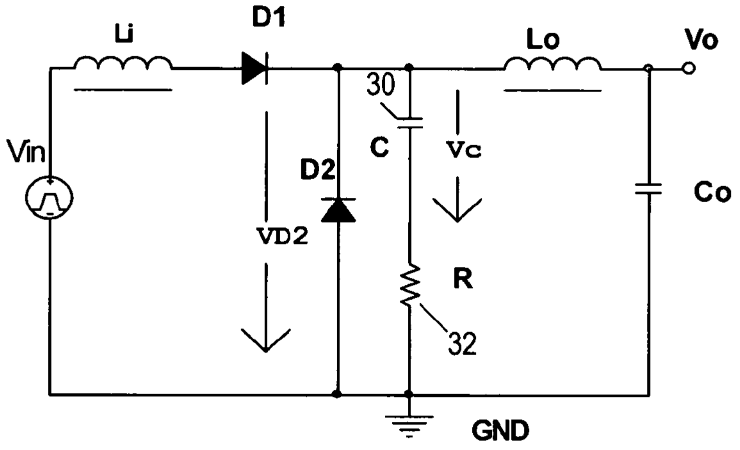
FIG. 2 is a schematic illustration of an equivalent circuit of a prior art DC-DC converter with a snubber circuit like that of FIG. 1.
Figure 9:
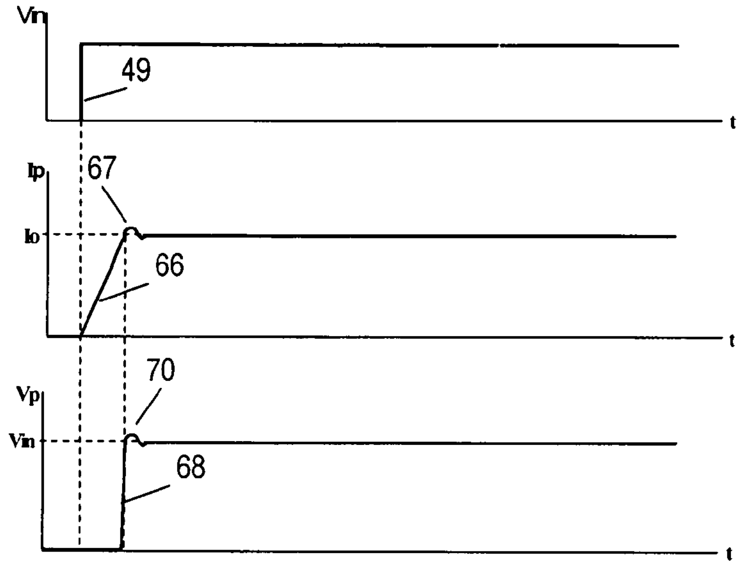
FIG. 9 is a series of plots like those of FIG. 6 showing voltages and currents in the circuit of FIG. 8.
Figure 10:
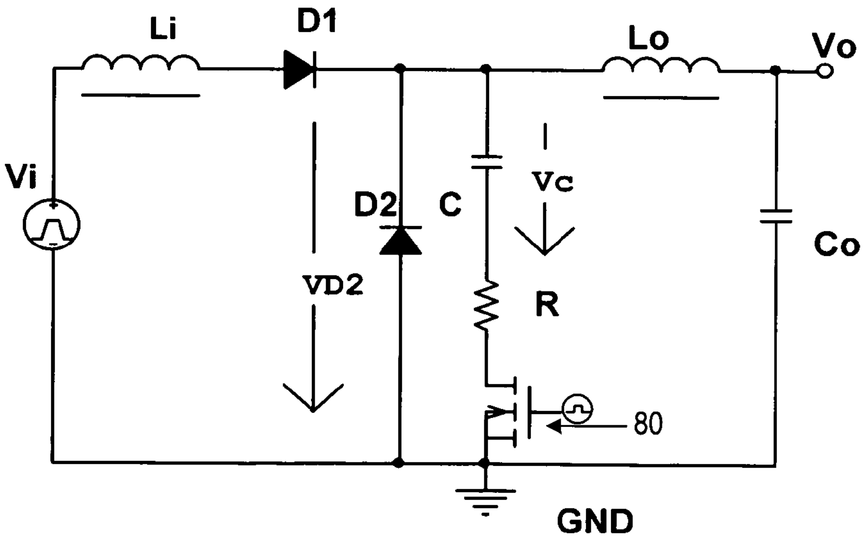
FIG. 10 is a schematic illustration of an equivalent circuit of a DC-DC converter having a MOSFET switch connected with an RC damping circuit in accordance with the invention.
Figure 11:
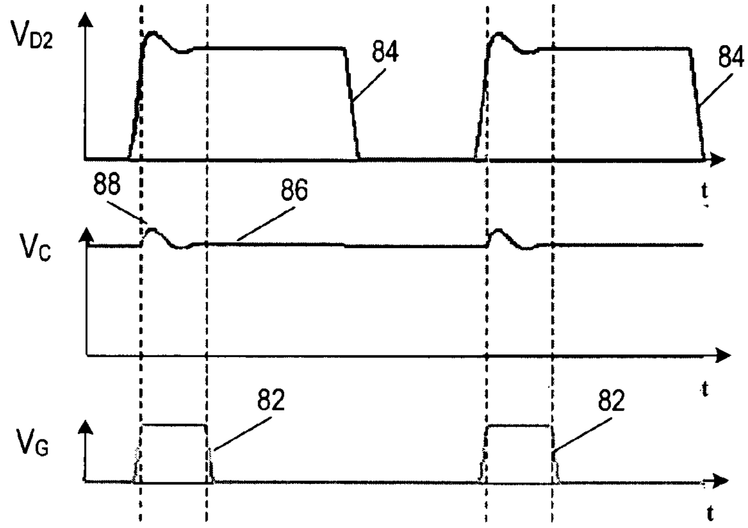
FIG. 11 is a series of plots against time of voltages in the circuit like that of FIG. 10, and shows correctly timed snubber switch control signals and the resultant voltages across the output rectifier diode and the capacitor of the snubber.

In FIG. 10, the equivalent circuit schematic is shown for a DC-DC converter like that of FIG. 2, but employing the active snubber circuit of the invention as described with respect to FIGS. 8 and 9. As stated, the conventional RC snubber was designed to damp any ringing generated by the transitions of the voltage across the main switch (Sw in FIG. 1, D2 in FIG. 2). During damping, the current flows through the RC snubber only for two or three cycles. After that, the ringing disappears. The snubber capacitor is charged. No current flows through the snubber resistor. At this moment there is no reason to allow the snubber capacitor to be discharged by the free-wheeling diode D2 through the snubber resistor. For this purpose, then, the additional switch in series in the RC snubber circuit is provided in accordance with the invention. In the specific exemplary embodiment depicted in FIG. 10, that switch is a MOSFET transistor 80. Illustrated in FIG. 11, the driving signal for the MOSFET switch 80 is gate voltage $V_G$. As shown, the MOSFET switch 80 is kept off until the next positive transition appears across the diode D2. Synchronously with this transition, the MOSFET switch is switched on and the snubber becomes active, damping the ringing. In FIG. 11, the correctly timed MOSFET driving signal $V_G$ appears at 82. The resultant, damped voltage $V_{D2}$ across the output rectifying diode D2, appears at 84. As shown at 86 in FIG. 11, the only voltage swing across the snubber capacitor is from the overshoot of the voltage across the free-wheeling diode D2 at 88. Assuming that the MOSFET switch is ideal, and that the RC snubber is trimmed to limit the overshoot of the voltage to 10 percent, power losses in the ordinary, prior art RC snubber are 121 times higher than in the active snubber of this invention. In the non-ideal, real-life embodiment, the ratio is a little lower because of the additional power losses in the MOSFET switch 80.

Figure 12:
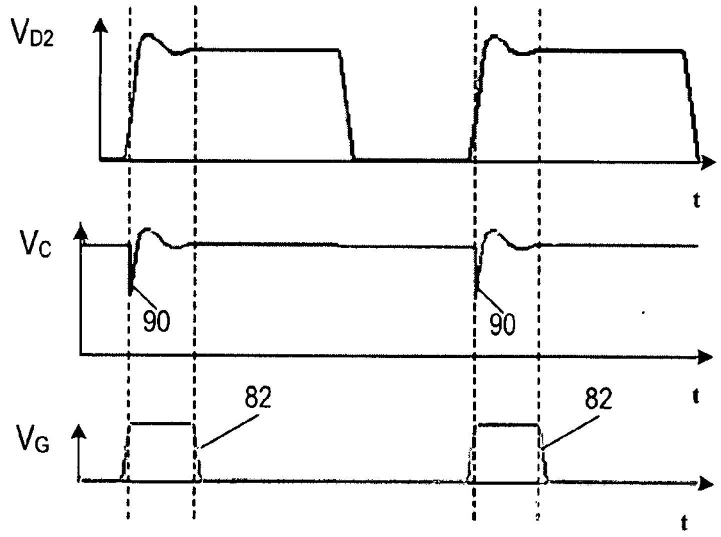
FIG. 12 is a series of plots against time like those of FIG. 11, but shows the effect of too early switching "on" of the snubber switch.
Figure 13:
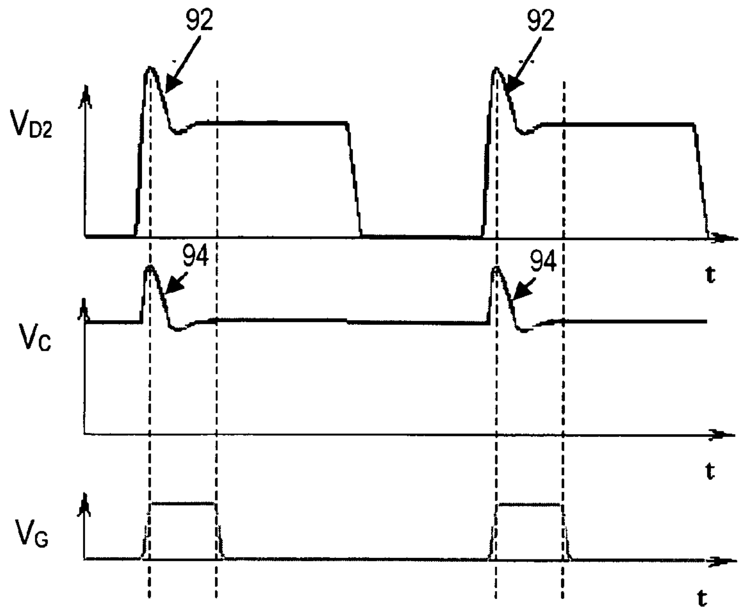
FIG. 13 is a series of plots like those of FIGS. 11 and 12 and shows the effect of too late switching "on" of the snubber switch.

To optimize the performance of the active snubber of this invention, timing is important. This is illustrated in FIGS. 12 and 13. FIG. 12 illustrates premature switching "on" of the active snubber by the MOSFET switch 80. The driving signal 82 is applied to the MOSFET switch too early in the onset of $V_{D2}$. Here, the snubber capacitor C is discharged more than necessary at 90 by virtue of being switched on before $V_{D2}$, the voltage across the output free-wheeling diode D2 has risen to the voltage $V_c$ across the snubber capacitor C. As illustrated in FIG. 13, turning "on" the MOSFET switch 80 too late results in the RC snubber circuit not being able to receive the energy stored in the parasitic inductances for the beginning of the cycle. The snubber will damp the ringing only after the MOSFET is switched on and the overvoltage shown at 92 with respect to the free-wheeling diode and at 94 with respect to the capacitor, will be much larger. In both of the situations, graphically illustrated in FIGS. 12 and 13, the power losses in the snubber circuit are higher than where the timing is correct. This is due to the increased voltage swing across the snubber capacitor. In addition, in the second situation, FIG. 13, the voltage stress on the free-wheeling diode D2 is much higher than when the timing of the MOSFET switching element 80 is correct.

When the timing is correct, the active snubber has the following advantages:

1. Reduction in a very efficient manner of the power losses on the snubber circuitry increasing the efficiency of, in the case of FIG. 10, the DC-DC converter.

2. The damping does not affect the switching time of the main switch because the snubber becomes active only at the end of the switching time, i.e. well along in the onset of the applied voltage $V_{D2}$.

3. Reduction in the size, tolerances and cost of the circuit components by virtue of reduced current and voltage swings with reduced stress.

Figure 14:
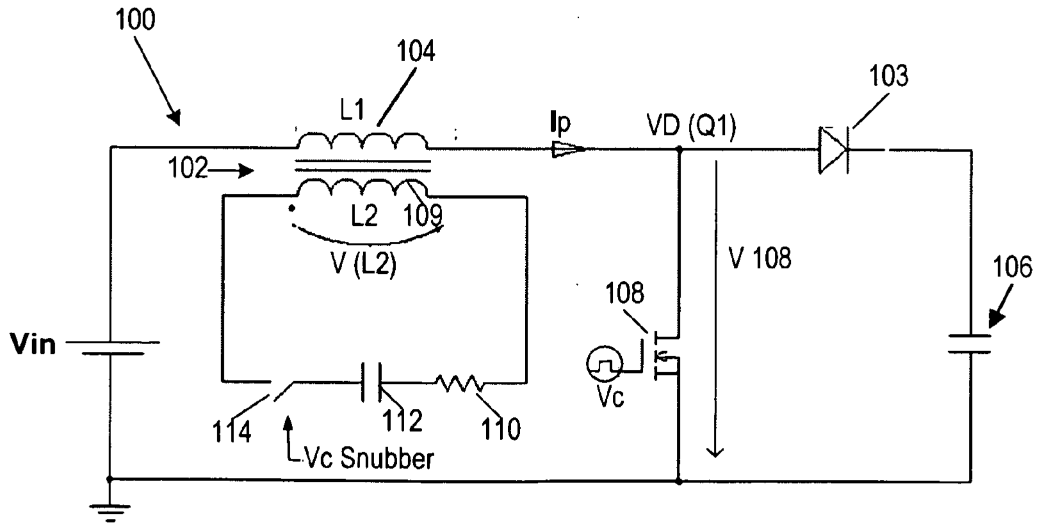
FIG. 14 is a schematic illustration of a boost converter employing an active snubber circuit, in accordance with the invention.
Figure 15:
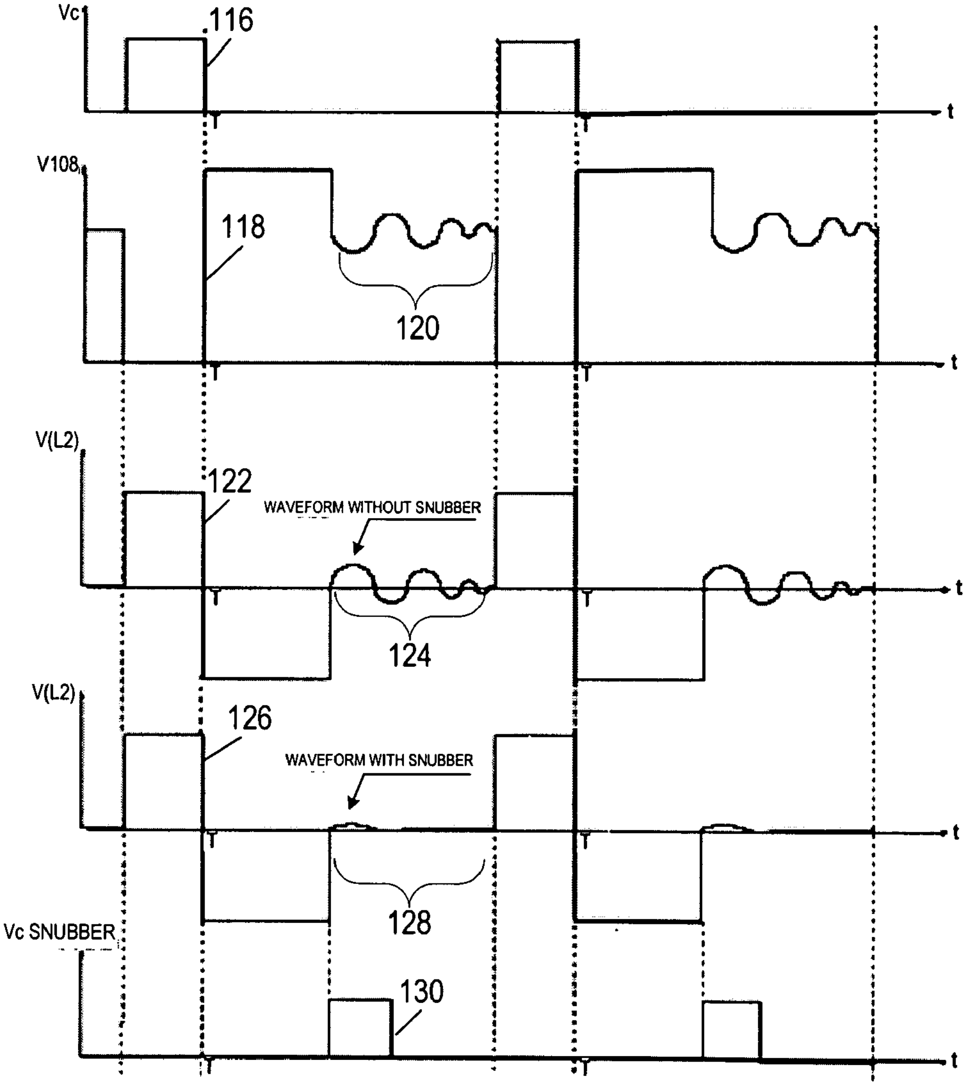
FIG. 15 is a series of plots of voltages of a circuit like that of FIG. 14 absent a snubber.

Turning to FIG. 14, a boost converter 100 is shown having a transformer 102. The transformer has a primary inductor 104 with a leakage inductance L1, a diode 103 and capacitor 106 all in the primary circuit. The capacitor 106 may be parasitic capacitances and it forms a tank circuit with the inductance L1 of the primary winding 104 of the transformer 102. A primary switch is, in this case, a MOSFET switch 108. This switch 108 functions in the manner of the switch SW of FIG. 1. In the secondary 109 of the transformer 102, L2 is the leakage inductance of the secondary winding 109, resistor 110 is the snubber resistor, and the capacitor 112 is the snubber capacitor. The switch 114 is the timed snubber switch and may be a MOSFET switch like that of FIG. 10. Here, the active snubber made up of the snubber resistor 110, snubber capacitor 112 and switch 114 are connected in parallel with the secondary winding of the transformer 102. In FIG. 15 at 116, the drive voltage Vc applied to the gate of MOSFET switch 108 is plotted. At 118 the voltage Vd across the MOSFET. switch 108 in the absence of damping is plotted and ringing is observed in the region 120. At 122 the voltage across the secondary winding or choke is plotted and the ringing is reflected as shown in the region 124. The drive voltage Vc snubber is plotted at 130 as shown. This closes the switch 114 at the onset of the ringing depicted at 120 and 124 and opens the switch 114 upon completion of damping and before the snubber capacitor 112 discharges. At 116 in FIG. 15, the active snubber 110, 112 and 114 of the invention is in use. The drive voltage Vc of the primary MOSFET switch 108 plotted at 116 is the same. At 126, the voltage across the secondary V(L2) is plotted and good damping of the ringing observed at 124 is evident in the region 128.

Although preferred embodiments of the invention have been described in detail, it will be readily appreciated by those skilled in the art that further modifications, alterations and additions to the invention embodiments disclosed may be made without departure from the spirit and scope of the invention as set forth in the appended claims. For example, although the change in capacitor charge state that occurs to damp ringing at the onset of an abrupt voltage change across a main switch or free-wheeling diode in embodiments of the invention described above is associated with a charging of the snubber capacitor, the current flow through a snubber resistor when damping occurs could, in particular circuits, be associated with a discharge of the snubber capacitor. What is important is the correctly timed change of the charged state of the capacitor and the prevention of the capacitor's reversion fully to its one charged state subsequent to damping.

We claim:

1. In a DC-DC converter having a rectifying diode, an input circuit coupled to the diode, an output circuit coupled to the diode, and a snubber circuit connected in parallel with the diodes, the snubber circuit having a capacitor and being tuned to damp resonant ringing in the output circuit upon abrupt current changes through the diode; the improvement comprising a controlled switching element connected in series with the capacitor and responsive to a control signal to complete and interrupt a current path to the capacitor, and a control signal source connected with the controlled switching element for applying to the controlled switching element a control signal timed to interrupt the current path to the capacitor subsequent to damping by the snubber circuit and prior to discharge of the capacitor and to complete the current path to the capacitor during a transition period when the abrupt current change occurs, at or before the onset of the ringing.

2. A power processing device including a circuit branch across which, in operation of the power processing device, voltage changes sufficiently abruptly to cause resonant ringing, a snubber circuit electrically connected with the circuit branch for damping resonant ringing upon such abrupt voltage changes, at least one capacitive element in the snubber circuit, an electrically controlled switching device in the snubber circuit electrically connected with the capacitive element in a charging and discharging current path to the capacitive element, and a source of timed control signals connected in controlling relation to the switching device to close the switching device, completing the current path to the capacitive element during the abrupt voltage change to effect a damping current flow in the path to the capacitive element and to open the switching device, interrupting the current path to the capacitive element to prevent further current flow prior to complete transition of the capacitive element to one of a fully charged and a fully discharged state.

3. The power processing device according to claim 2, wherein the capacitive element charges to damp ringing and the control signal opens the switching device to interrupt the current path to the capacitive element at the onset of discharge of the capacitive element.

4. The power processing device according to claim 2, wherein the snubber circuit is an RC circuit.

5. The power processing device according to claim 4, wherein the RC circuit is connected in parallel with the circuit branch.

6. The power processing device according to claim 5, wherein resistance in the RC circuit is close to the characteristic impedance of the parasitic resonant circuit.

7. The power processing device according to claim 4, wherein resistance in the RC circuit is close to the characteristic impedance of the parasitic resonant circuit.

8. The power processing device according to claim 2, wherein the source of timed control signals is timed to cause the switching device to complete the current path to the capacitive element only when the voltage abruptly charging voltage equals or exceeds the voltage across the capacitive element and before a first resonant spike is formed in the circuit.

* * * * *